(12) United States Patent
Snowdon

(10) Patent No.: US 8,525,575 B2
(45) Date of Patent: Sep. 3, 2013

(54) PASS TRANSISTOR CAPACITANCE AND JITTER REDUCTION

(75) Inventor: Kenneth P. Snowdon, Falmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 210 days.

(21) Appl. No.: 12/945,327

(22) Filed: Nov. 12, 2010

(65) Prior Publication Data

US 2012/0119796 A1 May 17, 2012

(51) Int. Cl.
*H03K 17/16* (2006.01)

(52) U.S. Cl.
USPC .......................................... 327/391; 327/388

(58) Field of Classification Search
USPC ................. 327/427, 379, 388, 389, 391, 108, 327/112
See application file for complete search history.

(56) References Cited

U.S. PATENT DOCUMENTS

| | | | |
|---|---|---|---|
| 5,281,870 A * | 1/1994 | Kobatake | 326/121 |
| 6,236,239 B1 * | 5/2001 | Kogushi | 326/88 |
| 7,095,266 B2 * | 8/2006 | Miske | 327/427 |
| 7,733,134 B1 * | 6/2010 | Nicholls | 327/109 |
| 8,289,066 B2 * | 10/2012 | Guo | 327/427 |

FOREIGN PATENT DOCUMENTS

CN 102611412 A 7/2012

* cited by examiner

*Primary Examiner* — Hai L Nguyen
(74) *Attorney, Agent, or Firm* — Schwegman Lundberg & Woessner P.A.

(57) ABSTRACT

A system includes a pass switch circuit and a first pass switch activation circuit. The pass switch circuit includes an impedance circuit and a pass transistor having a first source/drain connection, a second source/drain connection, and a gate input. The pass switch circuit passes an electronic signal from the first source/drain connection to the second source/drain connection in response to activation of the gate input. An impedance transfer function of the pass switch circuit is determined at least in part by an impedance of the impedance circuit and the impedance is sized to minimize attenuation of the electronic signal due to the impedance transfer function of the pass switch circuit. The first pass switch activation circuit provides a first activation signal to the gate input in response to an enable signal.

19 Claims, 7 Drawing Sheets

PASS TRANSISTOR CAPACITANCE AND JITTER REDUCTION

BACKGROUND

Electronic circuits and systems often include electronic switches. An electronic switch can be used to transmit an analog signal to a circuit path or to prevent an analog signal from being sent to a circuit path. Such a switch is sometimes referred to as an analog switch or a pass switch to differentiate this type of switch from a digital switch which changes its output state in response to an input, but does not pass a received signal. Passing an analog electronic signal through a pass switch can introduce jitter to the analog signal or result in a reduction in amplitude of the analog signal.

Overview

This document relates generally to electronic devices, and more specifically to reducing signal jitter from electronic switches. A system example comprises a pass switch circuit and a first pass switch activation circuit. The pass switch circuit includes an impedance circuit and a pass transistor having a first source/drain connection, a second source/drain connection, and a gate input. The pass switch circuit passes an electronic signal from the first source/drain connection to the second source/drain connection in response to activation of the gate input. An impedance transfer function of the pass switch circuit is determined at least in part by an impedance of the impedance circuit, and the impedance of the impedance circuit is sized to minimize attenuation of the electronic signal due to the impedance transfer function of the pass switch circuit. The first pass switch activation circuit provides a first activation signal to the gate input in response to an enable signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document relates generally to electronic signal communication and in particular, to electronic circuits for high speed data links. As explained above, passing an electronic signal through a pass switch can introduce jitter to the signal or result in a reduction in amplitude of the electronic signals. The reduction or attenuation of the signal can be due to the impedance transfer function of the pass switch. In some examples, a pass switch circuit may act as a high-pass network with a corner frequency at roughly fifty megahertz (50 MHz). Impedance of a pass switch at frequencies below the corner frequency can negatively affect electronic signals at data rates associated with broad band communications.

Figure 1:
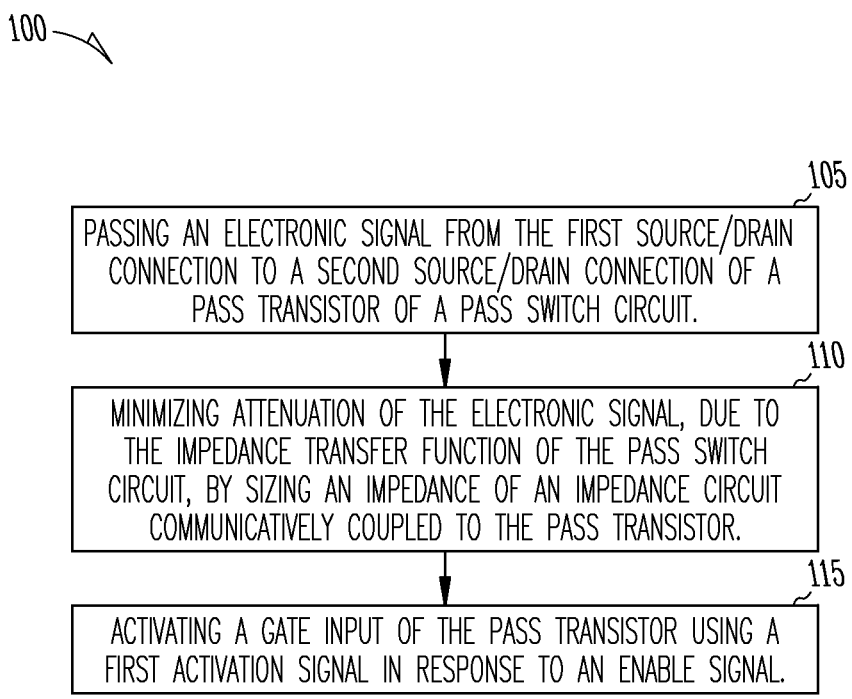
FIG. 1 is a flow diagram of a method of reducing signal jitter caused by pass switches.

FIG. 1 is a flow diagram of a method 100 of reducing jitter caused by pass switches. At block 105, an electronic signal is passed from the first source/drain connection to the second source/drain connection of a pass transistor of a pass switch circuit. The electronic signal includes at least a one signal frequency. Typically, an electronic data signal includes multiple frequencies. The frequencies are determined by the data rate and the data pattern of the signals.

Some frequency components of the electronic signal may be attenuated by the impedance transfer function of the pass switch. In particular, the higher frequency components of the signal are more likely to experience attenuation. Attenuation of these components of the signal may cause jitter in the electronic signal passed through the switch.

At block 110, attenuation of the electronic signal is minimized by sizing an impedance of an impedance circuit communicatively coupled to the pass transistor of the pass switch circuit. A pass transistor of a pass switch may perform as a high-pass circuit. Electrically connecting impedance to the pass transistor can effectively lower the corner frequency of the gate voltage supply circuit network attached to the pass transistor. In some examples, the corner frequency can be moved to about 1 MHz.

At block 115, a gate input of the pass transistor is activated using a first activation signal in response to an enable signal. Activating the gate allows a channel to form in the transistor to pass the electronic signal through the pass switch circuit.

Figure 2:
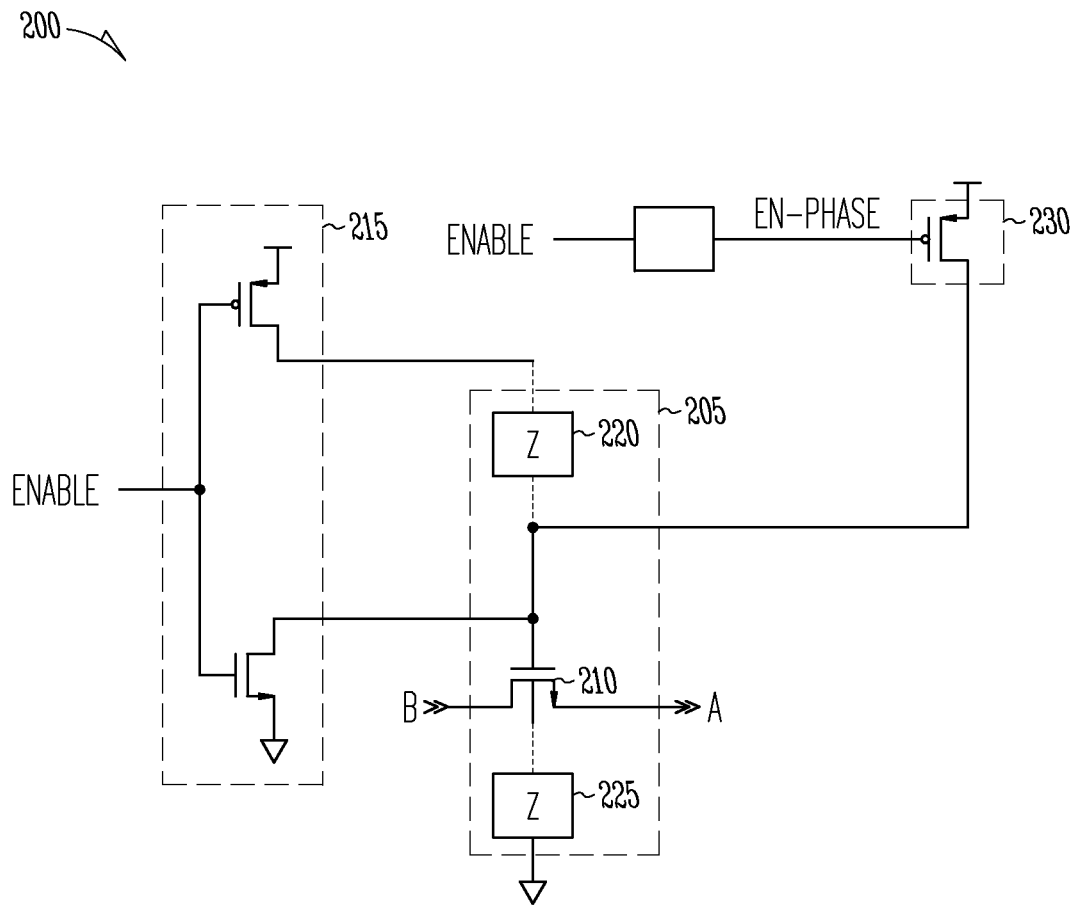
FIG. 2 is a diagram of portions of a system with reduced pass gate signal jitter.

FIG. 2 is a diagram of portions of a system 200 with reduced pass gate signal jitter. The system 200 includes a pass switch circuit 205 that includes a pass transistor 210. The pass transistor 210 has a first source/drain connection, a second source/drain connection, and a gate input. The pass switch circuit 205 passes an electronic signal from the first source/drain connection to the second source/drain connection in response to activation of the gate input.

The pass switch circuit 205 also includes an impedance circuit 220, 225 communicatively coupled to the pass transistor 210. The coupling is communicative in that electronic signals can be communicated between the pass transistor 210 and the impedance circuit 220, 225 even though there may be intervening circuitry. The impedance transfer function of the pass switch circuit 205 is determined at least in part by the impedance of the impedance circuit 220, 225. The value of the impedance of the impedance circuit is set or sized to minimize attenuation of the electronic signal due to the impedance transfer function of the pass switch circuit.

The impedance transfer function of the switch circuit is also partly determined by capacitance of the pass transistor 210. The gate input of the pass transistor 210 typically includes a large capacitance, but a small resistance. Capacitance at the gate input can form a high pass circuit network such that electronic signals with signal frequency higher than the corner frequency are subject to less attenuation than electronic signals with signal frequency lower than the corner frequency.

Increasing the impedance of the voltage supply network at the gate of the pass transistor can move the corner frequency lower. Thus, in some examples, an impedance circuit 220 is communicatively coupled to the gate input of the pass transistor 210. The resulting corner frequency of the impedance transfer function of the combined circuit can be made sufficiently low to minimize or avoid attenuation of the electronic signal by the pass switch circuit 205.

When the corner frequency is sufficiently lower than the frequencies of electronic data signals passed through the pass switch circuit 205 (e.g., an order of magnitude lower), the impedance of the pass switch circuit 205 is uniform for the data signals. This results in all of the data signals being subject to the same attenuation, which reduces jitter in the transmitted data.

Figure 3:
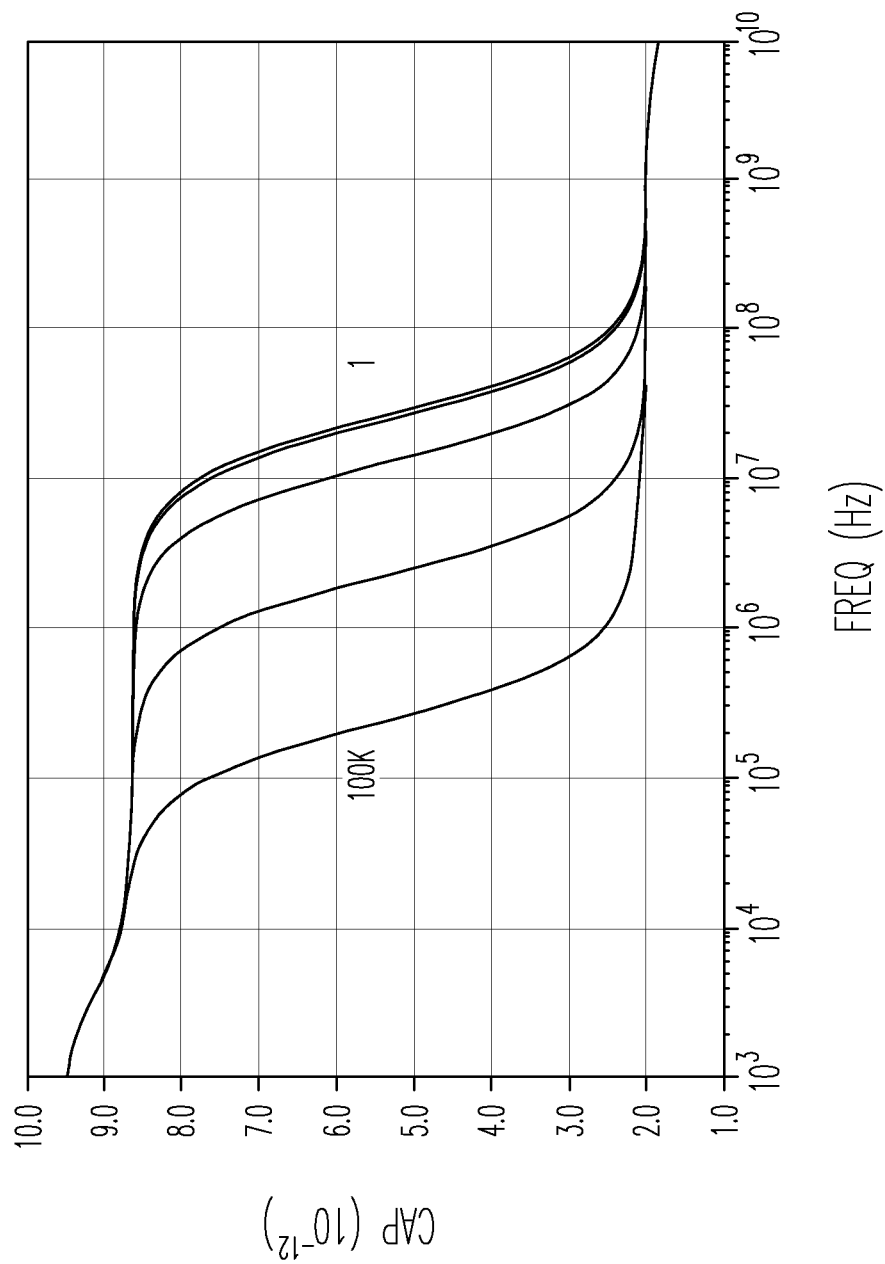
FIG. 3 shows graphs of capacitance versus frequency for different values of resistance seen at the gate input of a pass transistor.

FIG. 3 shows graphs of capacitance versus frequency for different values of resistance seen at the gate input of a pass transistor 210. Each graph corresponds to a different value of resistance seen at the gate input. It can be seen that changing the resistance changes the frequency at which the capacitance becomes significant at the gate input. The graphs show that when the resistance at the gate is 100 kilo-ohms (kΩ), signals frequencies of 10 MHz and higher are affected by a capacitance that is essentially uniform. Thus, in this example, an impedance of the impedance circuit of 100 kΩ sets the corner frequency sufficiently low to avoid attenuation of an electronic signal having a signal frequency of 10 MHz or higher. In certain examples, the impedance of the impedance circuit includes a resistance higher than 100 kΩ.

The impedance for the impedance circuit 220, 225 can be formed by several methods. In some examples, the impedance circuit 220, 225 includes an integrated resistor formed using source/drain diffusion. In some examples, the impedance circuit includes an integrated resistor formed using polysilicon. In some examples, the impedance circuit 220, 225 includes a resistance formed using a pinched junction field effect transistor.

The system 200 also includes a first pass switch activation circuit 215 communicatively coupled to the pass switch circuit 205. The first pass switch activation circuit 215 provides a first activation signal to the gate input in response to an enable signal.

Adding impedance to the pass transistor 210 can slow down the turn on time of the pass transistor 210. To speed up the turn on time, an extra activation pulse can be created to charge the gate of the pass transistor 210 to its operation potential.

In some examples, the system 200 includes a second pass switch activation circuit 230 communicatively coupled to the pass switch circuit 205. The second pass switch activation circuit 230 provides a second activation signal to the gate input of the pass transistor 210 in response to the enable signal.

Figure 4:
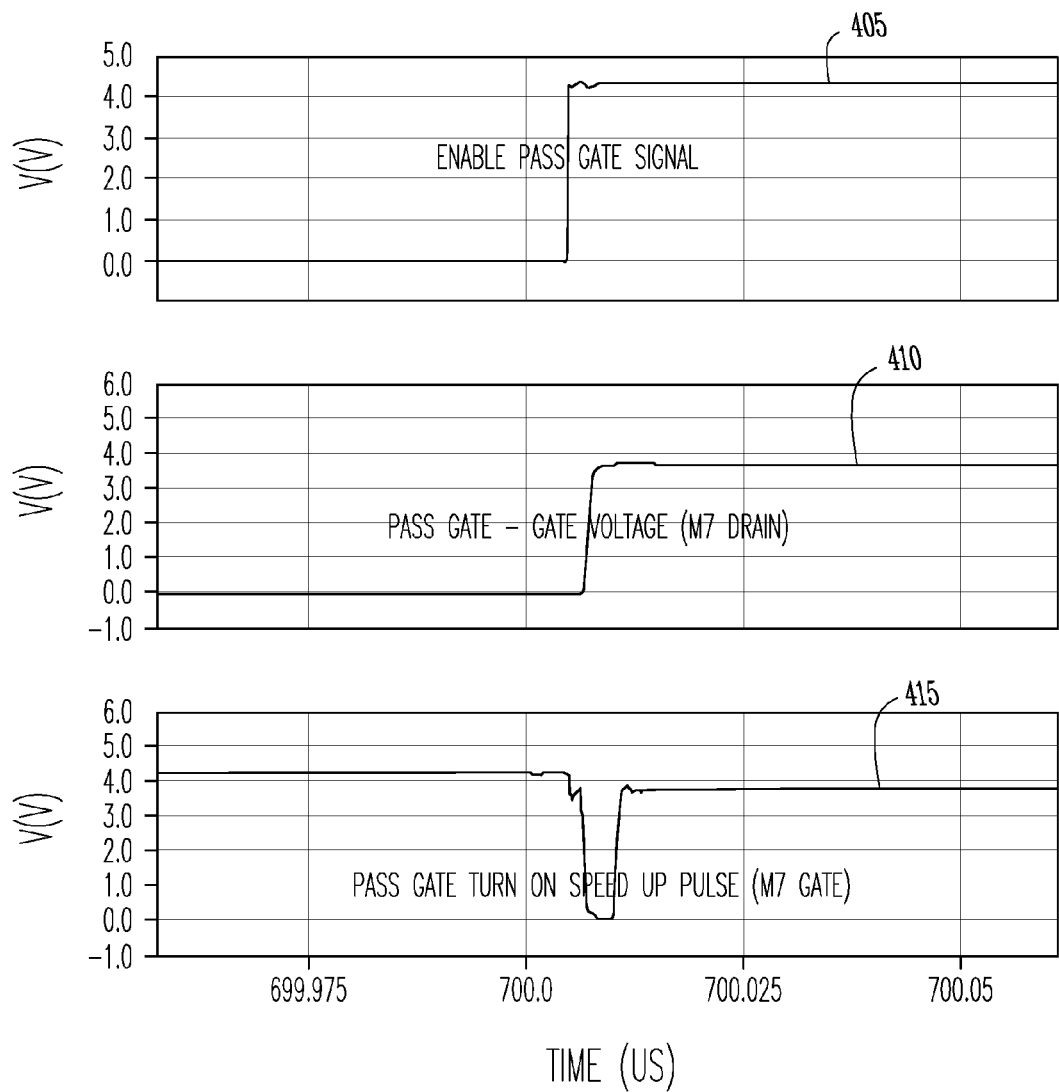
FIG. 4 shows graphs of activation signals for a pass switch circuit.

FIG. 4 shows graphs of activation signals. The top graph 405 is an enable signal used to generate the first and second activation signal. The middle graph 410 show the first activation signal generated by the first pass switch activation circuit 215. The added impedance of the impedance circuit 220 may cause a delay in the activation signal. The bottom graph 415 shows an example of a second activation signal to speed up the turn on time. Note that the activating edge of the second activation signal (negative-going edge) occurs before the activating edge of the first activation signal (positive-going edge). In some examples, the first activation signal and the second activation signal are over-lapping signals. In the example shown, the second activation signal is a pulse, but the second activation signal could remain at an active level longer after the activating edge of the first activation signal. The second activation speeds up the response time of the pass switch circuit 205 so that the pass switch circuit 205 operates with high speed signals even though the added impedance of the impedance circuit 220 would normally slow down the response time. In some examples, the second pass switch activation circuit 230 quickly provides the voltage of the second activation signal to the gate and then enters a high impedance state.

Figure 5:
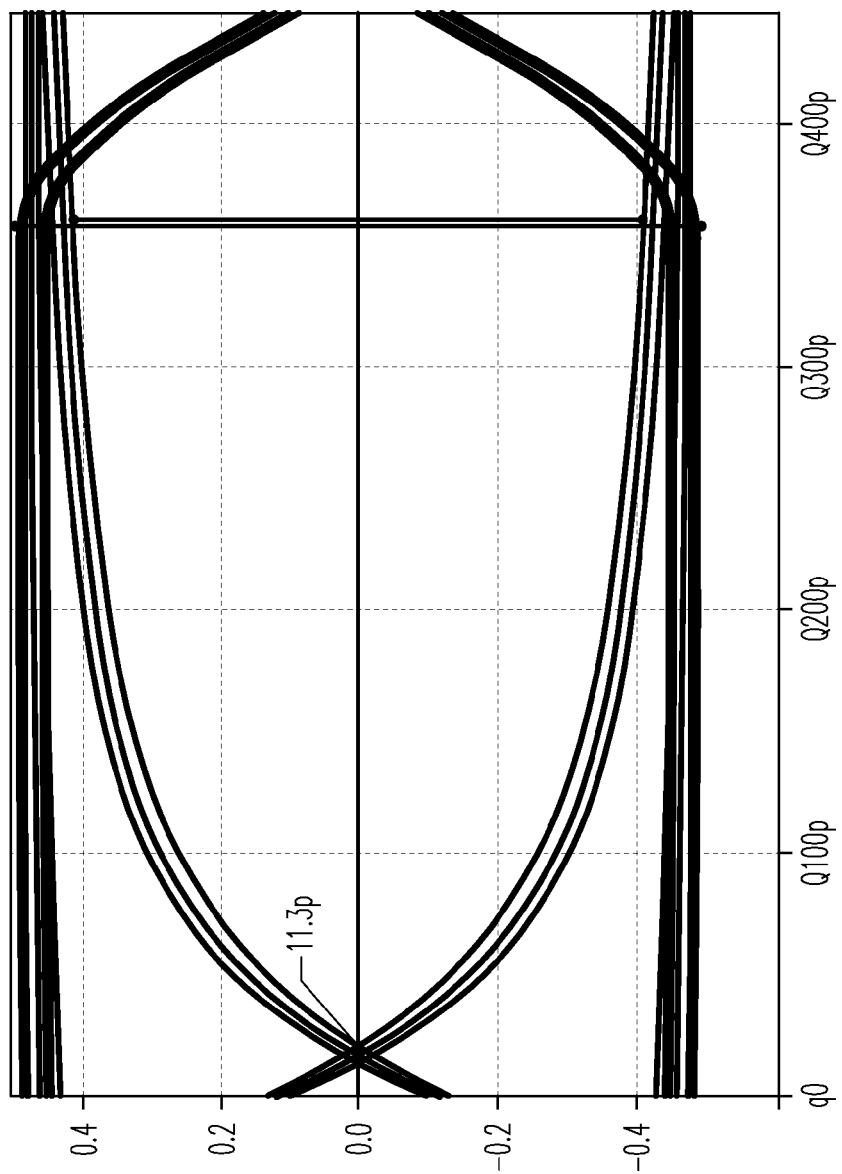
FIG. 5 is a graph showing an example of jitter in a data signal passed through a pass switch without compensating the pass switch transfer function.
Figure 6:
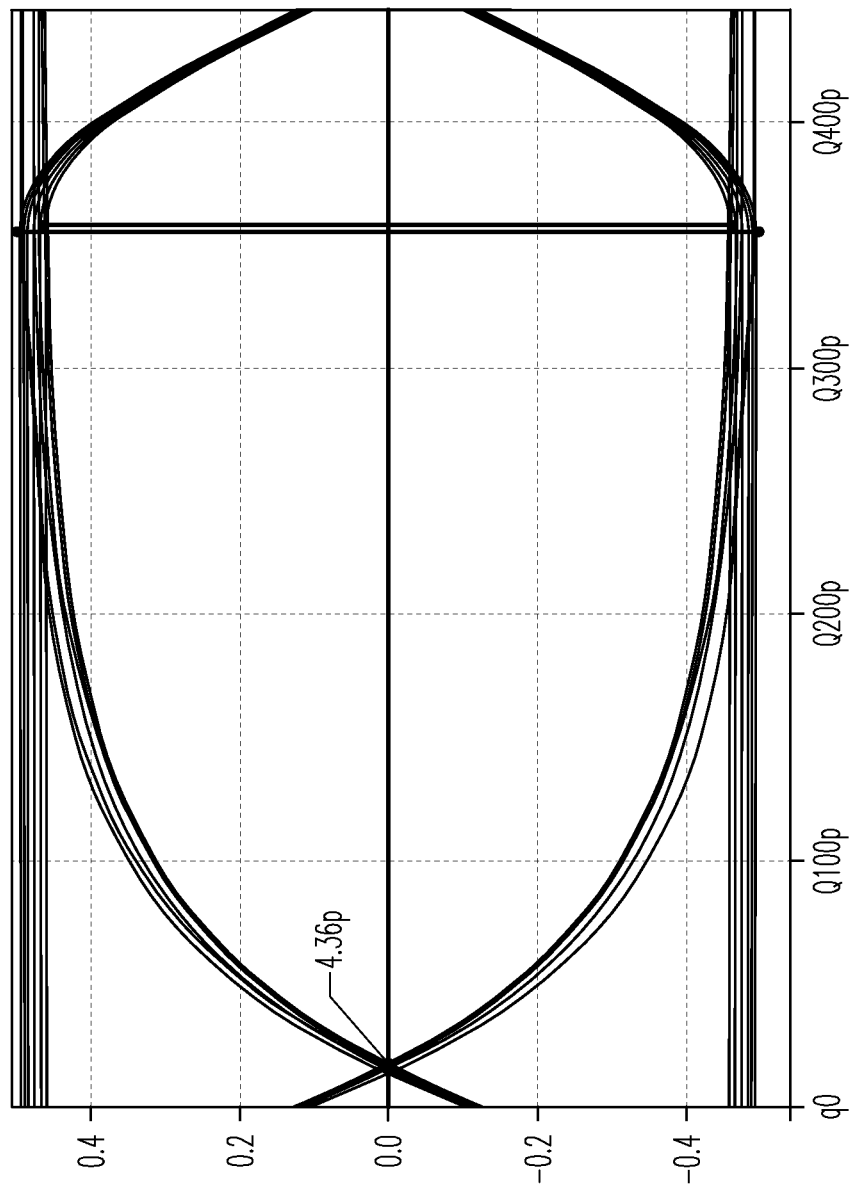
FIG. 6 is a graph showing an example of jitter in a data signal passed through a pass switch circuit with adjustment of the pass switch transfer function.

FIG. 5 is a graph showing an example of jitter in a data signal passed through a pass switch without adjusting the pole of the transfer function. Passing the signal through a pass switch introduced 11.3 picoseconds (ps) of jitter. FIG. 6 is a graph showing an example of jitter in a data signal passed through the pass switch circuit 205 in FIG. 2 with an added impedance circuit 220. The jitter is reduced to 4.36 ps.

Adding impedance to the gate input of the pass transistor 210 is only one approach of using an impedance circuit to change the transfer function of the pass switch circuit 205. In another example, the pass transistor 210 of the pass switch circuit 205 includes a bulk connection and an impedance circuit 225 is communicatively coupled to the bulk connection. In certain examples, the pass transistor 210 is an NMOS transistor and the connection is to a p-type bulk or p-well.

Figure 7:
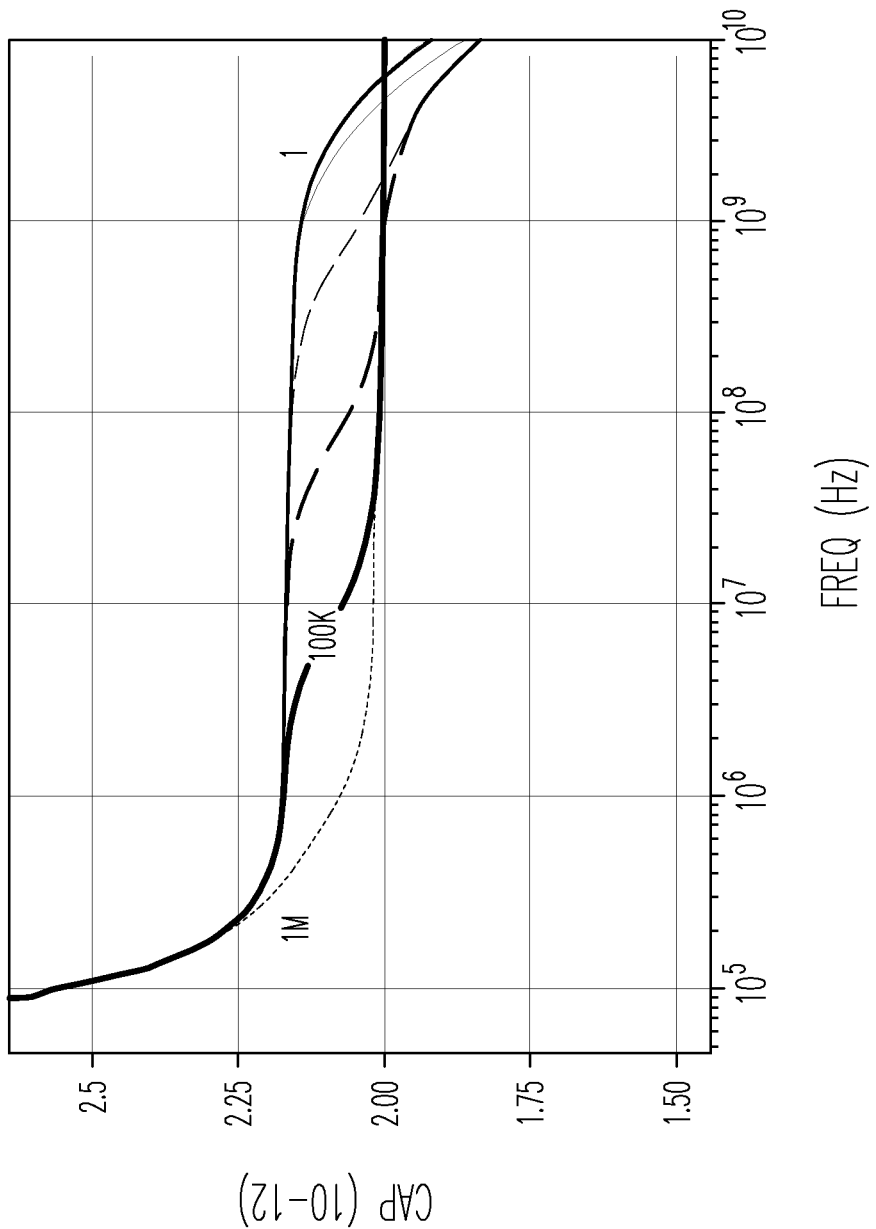
FIG. 7 shows graphs of capacitance versus frequency for different values of resistance seen at the bulk connection of a pass transistor.

FIG. 7 shows graphs of capacitance versus frequency for different values of resistance seen at the bulk connection of the pass transistor 210. The graphs show that when the resistance at the gate is 1 mega-ohm (MΩ), signals frequencies of 10 MHz and higher are affected by a capacitance that is essentially uniform, which reduces jitter in the data signal. The impedance for the impedance circuit can be formed by any of several methods as discussed previously. In some examples, a second activation signal is also used to speed up the turn on time of the pass transistor 210 when the impedance circuit 225 is coupled to the bulk connection of the transistor.

According to some examples, a combination of an impedance circuit at the gate input of the transistor and an impedance circuit at the bulk connection of the transistor is used to change the transfer function of the pass switch circuit 205. In some examples, the pass switch circuit 205 includes a second transistor coupled in parallel with the pass transistor 210, such that the pass transistor 210 and the second transistor form a complementary metal oxide semiconductor transistor pair.

In some examples, the system includes an integrated circuit and the pass switch circuit 205, the first pass switch activation circuit 215, and the impedance circuit 220, 225 are included in the integrated circuit. In some examples, the integrated circuit is included in a cellular telephone. In some examples, the integrated circuit is included in a memory, such as a flash memory, random access memory, or read only memory. In some examples the integrated circuit is included in an interface circuit for data storage, such as for a CD-ROM or DVD. Changing the impedance transfer function of one or pass switches in such an integrated circuit reduces jitter and allows for a faster interface to such devices.

Additional Notes

This document describes devices, systems, and methods to reduce signal jitter caused by electronic switches. In Example 1, a system comprises a pass switch circuit including a pass transistor having a first source/drain connection, a second source/drain connection, and a gate input. The pass switch circuit is configured to pass an electronic signal from the first source/drain connection to the second source/drain connection in response to activation of the gate input. The pass switch circuit also includes an impedance circuit communicatively coupled to the pass transistor, wherein an impedance transfer function of the pass switch circuit is determined at least in part by an impedance of the impedance circuit, and wherein the impedance of the impedance circuit is sized to minimize attenuation of the electronic signal due to the impedance transfer function of the pass switch circuit. The pass switch circuit further includes a first pass switch activation circuit communicatively coupled to the pass switch circuit and configured to provide a first activation signal to the gate input in response to an enable signal.

In Example 2, the impedance of the impedance circuit of Example 1 optionally sets a corner frequency of the impedance transfer function sufficiently low to avoid attenuation of an electronic signal having a signal frequency of ten megahertz (10 MHz) or higher.

In Example 3, the system of one or any combination of Examples 1 and 2 optionally includes a second pass switch activation circuit communicatively coupled to the pass switch circuit, wherein the second pass switch activation circuit is configured to provide a second activation signal to the gate input in response to the enable signal, and wherein an activating edge of the second activation signal occurs before an activating edge of the first activation signal.

In Example 4, the first activation signal and the second activation signal of Example 3 are optionally over-lapping signals.

In Example 5, the impedance circuit of one or any combination of Examples 1-4 can be optionally communicatively coupled to the gate input and the first pass switch activation circuit.

In Example 6, the pass transistor of one or any combination of Examples 1-5 optionally includes a bulk connection, and the impedance circuit can be communicatively coupled to the bulk connection.

In Example 7, the impedance circuit of one or any combination of Examples 1-6 optionally includes an integrated resistor formed using source/drain diffusion.

In Example 8, the impedance circuit of one or any combination of Examples 1-7 optionally includes a pinched junction field effect transistor.

In Example 9, the impedance circuit of one or any combination of Examples 1-8 optionally includes an integrated resistor formed using polysilicon.

In Example 10, the pass switch circuit of one or any combination of Examples 1-9 optionally includes a second transistor, wherein the pass transistor and the second transistor form a complementary metal oxide semiconductor transistor pair.

In Example 11, the impedance of the impedance circuit of one or any combination of Example 1-10 optionally includes a resistance of about one hundred kilo-ohms (100 kΩ) or higher.

In Example 12, the system of one or any combination of Examples 1-11 optionally includes an integrated circuit, wherein the pass switch circuit and the first pass switch activation circuit are included in the integrated circuit.

In Example 13, the integrated circuit of Example 12 can optionally be included in a cellular telephone.

Example 14 can include subject matter, or can optionally by combined with the subject matter of one or any combination of Examples 1-13 to include subject matter (such as a method, a means for performing acts, or a machine-readable medium including instructions that, when performed by the machine, cause the machine to perform acts), comprising passing an electronic signal from a first source/drain connection to a second source/drain connection of a pass transistor of a pass switch circuit, minimizing attenuation of the electronic signal, due to the impedance transfer function of the pass switch circuit, by sizing an impedance of an impedance circuit communicatively coupled to the pass transistor, and activating a gate input of the pass transistor using a first activation signal in response to an enable signal.

In Example 15, the subject matter of Example 14 can optionally include activating a gate input of the pass transistor using a second activation signal in response to the enable signal, wherein an activating edge of the second activation signal occurs before an activating edge of the first activation signal.

In Example 16, the activating a gate input of the pass transistor using a second activation signal of one or any combination of Examples 14 and 15 can optionally include activating a gate input of the pass transistor using a second activation signal that overlaps the first activation signal.

In Example 17, the minimizing attenuation of the electronic signal of one or any combination of Examples 14-16 can optionally include setting a corner frequency of the impedance transfer function of the pass switch circuit sufficiently low to avoid attenuation of an electronic signal having a signal frequency of ten megahertz (10 MHz) or higher.

In Example 18, the minimizing attenuation of the electronic signal of one or any combination of Examples 14-17 can optionally include setting a corner frequency of the impedance transfer function of the pass switch circuit to about one megahertz (1 MHz).

In Example 19, the sizing an impedance of an impedance circuit of one or any combination of Examples 14-18 can optionally include sizing an impedance of an impedance circuit communicatively coupled to the gate input of the pass transistor.

In Example 20, the sizing an impedance of an impedance circuit of one or any combination of Examples 14-19 can optionally include sizing an impedance of an impedance circuit communicatively coupled to a bulk connection of the pass transistor.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

In an example, any portion of the examples included herein can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A system comprising:
   a pass switch circuit including:
      a pass transistor having a first source/drain connection, a second source/drain connection, and a gate input, wherein the pass switch circuit is configured to pass an electronic signal from the first source/drain connection to the second source/drain connection in response to activation of the gate input; and
      an impedance circuit communicatively coupled to the pass transistor, wherein an impedance transfer function of the pass switch circuit is determined at least in part by an impedance of the impedance circuit, and wherein the impedance of the impedance circuit sets the corner frequency of the impedance transfer function of the combined pass switch circuit and impedance circuit sufficiently low to minimize attenuation of the electronic signal;
   a first pass switch activation circuit communicatively coupled to the pass switch circuit and configured to provide a first activation signal to the gate input in response to an enable signal; and
   a second pass switch activation circuit communicatively coupled to the pass switch circuit, wherein the second pass switch activation circuit is configured to provide a pre-activation signal to the gate input in response to the enable signal, and wherein an activating transition of the pre-activation signal occurs before an activating transition of the first activation signal.

2. The system of claim 1, wherein the impedance of the impedance circuit sets the corner frequency of the impedance transfer function sufficiently low to minimize attenuation of an electronic signal having a signal frequency of ten megahertz (10 MHz) or higher.

3. The system of claim 1, wherein the first activation signal and the second activation signal are over-lapping signals.

4. The system of claim 1, wherein the impedance circuit is communicatively coupled to the gate input and the first pass switch activation circuit.

5. The system of claim 1,
   wherein the pass transistor includes a bulk connection, and
   wherein the impedance circuit is communicatively coupled to the bulk connection.

6. The system of claim 1, wherein the impedance circuit includes an integrated resistor formed using source/drain diffusion.

7. The system of claim 1, wherein the impedance circuit includes a pinched junction field effect transistor.

8. The system of claim 1, wherein the impedance circuit includes an integrated resistor formed using polysilicon.

9. The system of claim 1, wherein the pass switch circuit includes a second transistor, wherein the pass transistor and the second transistor form a complementary metal oxide semiconductor transistor pair.

10. The system of claim 1, wherein the impedance of the impedance circuit includes a resistance of about one hundred kilo-ohms (100 kΩ) or higher.

11. The system of claim 1, including an integrated circuit, wherein the pass switch circuit and the first pass switch activation circuit are included in the integrated circuit.

12. The system of claim 11, wherein the integrated circuit is included in a cellular telephone.

13. A method comprising:
   passing an electronic signal from a first source/drain connection to a second source/drain connection of a pass transistor of a pass switch circuit;
   electrically coupling an impedance circuit to the pass transistor to set a corner frequency of a frequency response of the combined pass switch circuit and impedance circuit sufficiently low to minimize attenuation of the electronic signal;
   activating a gate input of the pass transistor using a first activation signal in response to an enable signal; and
   pre-activating the gate input of the pass transistor using a pre-activation signal, wherein an activating transition of the pre-activation signal occurs before an activating transition of the first activation signal.

14. The method of claim 13, including activating a gate input of the pass transistor using a second activation signal in response to the enable signal, wherein an activating transition of the second activation signal occurs before an activating transition of the first activation signal.

15. The method of claim 14, wherein activating a gate input of the pass transistor using a second activation signal includes activating a gate input of the pass transistor using a second activation signal that overlaps the first activation signal.

16. The method of claim 13, wherein minimizing attenuation of the electronic signal includes setting the corner frequency of the impedance transfer function of the pass switch circuit sufficiently low to avoid attenuation of an electronic signal having a signal frequency of ten megahertz (10 MHz) or higher.

17. The method of claim 13, wherein minimizing attenuation of the electronic signal includes setting a corner frequency of the impedance transfer function of the pass switch circuit to about one megahertz (1 MHz).

18. The method of claim 13, wherein sizing an impedance of an impedance circuit includes sizing an impedance of an impedance circuit communicatively coupled to the gate input of the pass transistor.

19. The method of claim 13, wherein sizing an impedance of an impedance circuit includes sizing an impedance of an impedance circuit communicatively coupled to a bulk connection of the pass transistor.

* * * * *